United States Patent
Liao et al.

(10) Patent No.: US 11,764,127 B2
(45) Date of Patent: Sep. 19, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Jen-Chun Liao, Taipei (TW); Sung-Yueh Wu, Chiayi County (TW); Chien-Ling Hwang, Hsinchu (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 133 days.

(21) Appl. No.: 17/185,966

(22) Filed: Feb. 26, 2021

(65) Prior Publication Data
US 2022/0278023 A1  Sep. 1, 2022

(51) Int. Cl.

| | |
|---|---|
| *H01L 23/48* | (2006.01) |
| *H01L 23/15* | (2006.01) |
| *H01L 21/768* | (2006.01) |
| *H01L 23/498* | (2006.01) |
| *H01L 21/56* | (2006.01) |
| *H01L 23/538* | (2006.01) |
| *H01L 23/31* | (2006.01) |

(52) U.S. Cl.
CPC ........... *H01L 23/481* (2013.01); *H01L 21/56* (2013.01); *H01L 21/76898* (2013.01); *H01L 23/15* (2013.01); *H01L 23/3128* (2013.01); *H01L 23/49833* (2013.01); *H01L 23/49838* (2013.01); *H01L 23/5385* (2013.01); *H01L 23/5386* (2013.01)

(58) Field of Classification Search
CPC . H01L 23/481; H01L 21/56; H01L 21/76898; H01L 23/49838; H01L 23/5385; H01L 23/5386
See application file for complete search history.

(56) References Cited

U.S. PATENT DOCUMENTS

| | | | |
|---|---|---|---|
| 8,716,873 B2 * | 5/2014 | Wang | H01L 23/481 257/786 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| (Continued) | | | |

*Primary Examiner* — Nicholas J Tobergte
(74) *Attorney, Agent, or Firm* — JCIPRNET

(57) ABSTRACT

A semiconductor package and a manufacturing method are provided. The semiconductor package includes a carrier substrate, a through substrate via (TSV), a first conductive pattern, and an encapsulated die. The TSV penetrates through the carrier substrate and includes a first portion and a second portion connected to the first portion, the first portion includes a first slanted sidewall with a first slope, the second portion includes a second slanted sidewall with a second slope, and the first slope is substantially milder than the second slope. The first conductive pattern is disposed on the carrier substrate and connected to the first portion of the TSV. The encapsulated die is disposed on the carrier substrate and electrically coupled to the TSV through the first conductive pattern.

20 Claims, 13 Drawing Sheets

(56) References Cited

U.S. PATENT DOCUMENTS

| | | | |
|---|---|---|---|
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2011/0210452 A1* | 9/2011 | Roozeboom | H01L 21/4846 257/E21.597 |
| 2012/0153499 A1* | 6/2012 | Byun | H01L 23/481 257/774 |
| 2013/0032947 A1* | 2/2013 | Park | H01L 21/568 257/777 |
| 2013/0193585 A1* | 8/2013 | Lin | H01L 21/3086 257/774 |
| 2017/0069532 A1* | 3/2017 | Lee | H01L 24/96 |
| 2018/0102313 A1* | 4/2018 | Shih | H01L 21/6835 |
| 2018/0342450 A1* | 11/2018 | Huang | H01L 21/4864 |
| 2020/0126929 A1* | 4/2020 | Jeong | H01L 21/561 |
| 2021/0066882 A1* | 3/2021 | Dobriyal | H01S 5/0234 |

* cited by examiner

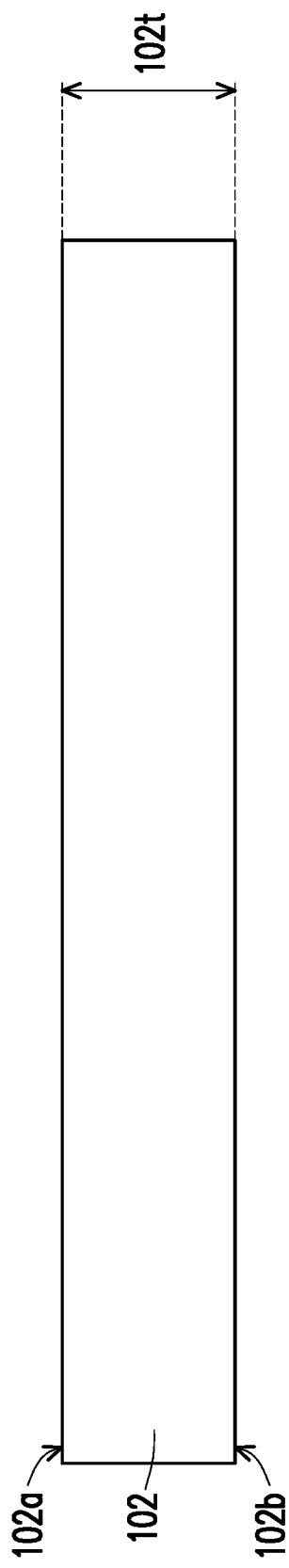

SEMICONDUCTOR PACKAGE AND MANUFACTURING METHOD THEREOF

BACKGROUND

Semiconductor devices are used in a variety of electronic applications, such as personal computers, cell phones, digital cameras, and other electronic devices. As electronic products are continuously miniaturized, heat dissipation of semiconductor devices has become an important issue for packaging technology. Moreover, in the packaging of semiconductor devices, through via connections may be used to provide electrical connections between the vertically arranged integrated circuit components. The formation of these through vias has impacts on data transmission speed and reliability of the semiconductor devices. There is a continuous need for more reliable semiconductor devices having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1E are schematic cross-sectional views of various stages of manufacturing a substrate structure in accordance with some embodiments.

DETAILED DESCRIPTION

Figure 1B:
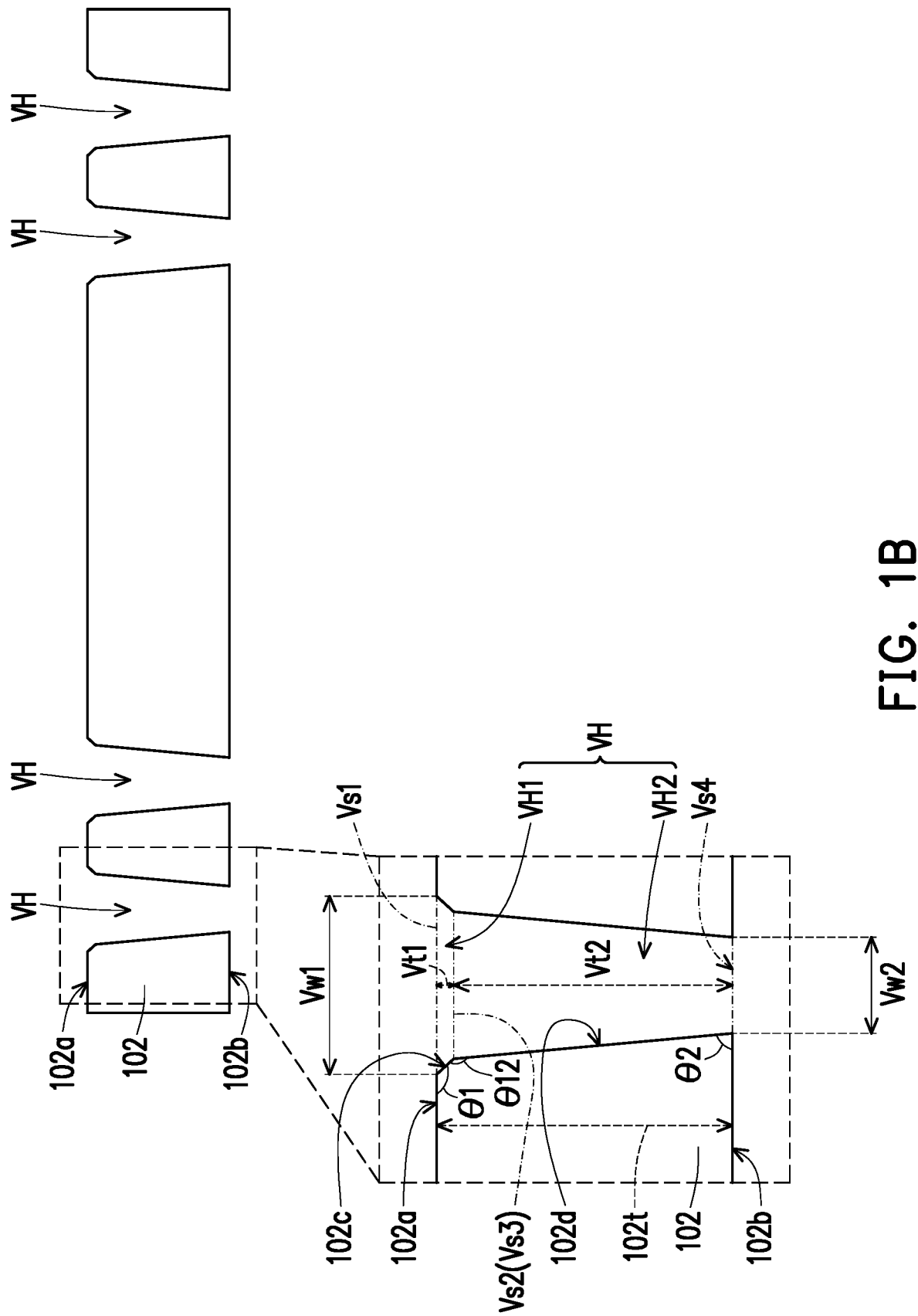

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1E are schematic cross-sectional views of various stages of manufacturing a substrate structure in accordance with some embodiments. Referring to FIG. 1A, a carrier substrate 102 having a first surface 102a and a second surface 102b opposite to the first surface 102a is provided. The carrier substrate 102 may have a thickness 102t ranging between about 0.1 mm and about 1 mm. In some embodiments, the carrier substrate 102 is provided in a wafer form. Alternatively, the carrier substrate 102 may be provided in any other suitable form (e.g., a panel form, a chip form, a strip form, etc.) depending on process requirements.

In some embodiments, a material of the carrier substrate 102 is selected to have material properties of high thermal conductivity to provide improved heat dissipation. In some embodiments, the carrier substrate 102 is made of ceramic or other suitable heat-dissipating material(s). The carrier substrate 102 may be referred to as a ceramic substrate or a heat-dissipating substrate in accordance with some embodiments. For example, a material of the carrier substrate 102 includes aluminum oxide ($Al_2O_3$), aluminum nitride (AlN), silicon carbide (SiC), silicon nitride ($Si_3N_4$), boron nitride (BN), zirconia ($ZrO_2$), or other suitable materials. In some embodiments, the carrier substrate 102 is made of aluminum oxide ($Al_2O_3$), and the thermal conductivity of the carrier substrate 102 may be in a range of about 20 W/m-k and about 24 W/m-k. In some embodiments, the carrier substrate 102 is made of aluminum nitride (AlN), and the thermal conductivity of the carrier substrate 102 may range between about 170 W/m-k and about 220 W/m-k. It should be noted that the last-mentioned values only serve as examples, and other suitable carrier materials having good heat dissipation properties may be used.

Referring to FIG. 1B, portions of the carrier substrate 102 may be removed to form a plurality of via holes VH. In some embodiments, a drilling operation is performed on the carrier substrate 102 to form the via holes VH. For example, the via-hole drilling operation includes a laser drilling process, followed by a post-drill cleaning process to remove the residue during the operation. In some embodiments, a laser is directed toward those portions of the carrier substrate 102 which are desired to be removed in order to form the via holes VH. It is understood that the characteristics of the via holes may be controlled by varying the laser exposure conditions (e.g., wavelength, pulse duration, pulse energy, repetition rate, etc.) and/or other process parameters. In certain instances, fiber lasers, with power levels over 1 kW and repetition rates below 10 kHz, are used for drilling the carrier substrate 102; however, sidewall profiles of such via holes formed by using the fiber laser is nearly vertical which may not facilitate the subsequent formation of seed material. On the other hand, it is understood that the thermal effects during the laser drilling process need to be well-controlled to avoid cracking of the substrate. In certain circumstances, using the fiber lasers with high power levels to form via holes may cause uncontrolled cracking, thereby reducing the strength of the carrier substrate.

In order to avoid cracking of the carrier substrate, the laser with lower output power may be employed. For example, diode-pumped solid state (DPSS) laser (e.g., ultraviolet (UV) laser, infrared (IR) laser, etc.) with lower output power is employed for the via-hole drilling operation. As compared to using the fiber lasers, the drilling process using the DPSS laser with lower power and higher repetition rate may result in less thermal damage on the carrier substrate 102. For example, the UV laser at 355 nm, with higher repetition rate (e.g., above 1 MHz) and lower power (e.g., less than 30 Watts), is used to perform the laser drilling process for forming the via holes. It is understood that the laser processing throughput (e.g., via-hole drilling on the substrate) is limited by the laser power intensity, and thus using the UV laser with lower power may decrease throughput. On the other hand, the UV lasers capable of operating at high energy are expensive. In some embodiments, the IR laser at 1064 nm, with high repetition rate (e.g., above 1 MHz) and power levels higher than 30 Watts (e.g., less than 200 Watts), is used to perform the via-hole drilling process on the carrier substrate 102. As compared to using the UV laser with lower power, the IR laser (at higher power than that of the UV laser) may deliver a greater via-hole formation throughput. Moreover, the cost of using the IR laser may be less than that of using the higher powered UV laser to obtain the higher throughput.

In some embodiments, during the via-hole drilling operation, debris deposed on the carrier substrate 102 is subsequently removed by a cleaning step (e.g., etching or any suitable removal technique). In some embodiments, after the cleaning, the inner sidewalls of the carrier substrate 102 that define the via holes VH become smoother which may be beneficial to the subsequent seed material deposition. For example, as shown in the enlarged view in FIG. 1B, the respective via hole VH is defined by the non-vertical inner sidewalls of the carrier substrate 102. It should be appreciated that as compared to using the fiber laser with power level over 1 kW to form the via hole having vertical sidewalls, using the IR laser with lower power (e.g., below 200 Watts) may render the via hole VH having the substantially tapered cross-section which facilitates the formation of seed material in the subsequent process. In some embodiments, the laser drilling operation is performed on the first surface 102a of the carrier substrate 102 to render the sidewalls of the respective via hole VH tapering from the first surface 102a toward the second surface 102b.

In some embodiments, the respective via hole includes a first portion VH1 and a second portion VH2 connected to the first portion VH1, where the first portion VH1 is in proximity to the first surface 102a and the second portion VH2 is in proximity to the second surface 102b. The respective via hole VH may fully penetrate through the carrier substrate 102, so that the thickness 102t of the carrier substrate 102 is equal to the combination of the depth Vt1 of the first portion VH1 and the depth Vt2 of the second portion VH2. In some embodiments, the depth Vt1 of the first portion VH1 is less than the depth Vt2 of the second portion VH2. Alternatively, the depth of the first portion VH1 may be substantially equal to (or greater than) that of the second portion VH2, depending on the process parameters of the laser machining processes.

With continued reference to the cross-sectional and enlarged view in FIG. 1B, the cross-sectional profile of the first portion VH1 may possess an inverted trapezoidal shape having a virtual longer side Vs1 in proximity to the first surface 102a of the carrier substrate 102 and a virtual shorter side Vs2 opposite to the virtual longer side Vs1. In some embodiments, the cross-sectional profile of the second portion VH2 may also possess an inverted trapezoidal shape having a virtual shorter side Vs4 in proximity to the second surface 102b of the carrier substrate 102 and a virtual longer side Vs3 opposite to the virtual shorter side Vs4 and equal to the virtual shorter side Vs2 of the first portion VH1. In some embodiments, a maximum lateral dimension (e.g., the maximum width or the diameter) Vw1 of the virtual longer side Vs1 of the first portion VH1 is greater than the minimum lateral dimension (e.g., the width or the diameter) Vw2 of the virtual short side Vs4 of the second portion VH2. For example, the maximum lateral dimension Vw1 of the first portion VH1 is in a range of about 0.05 mm and about 0.5 mm, and the minimum lateral dimension Vw2 of the second portion VH2 is in a range of about 0.01 mm and about 0.5 mm.

In some embodiments, a first inner sidewall 102c of the carrier substrate 102 connected to the first surface 102a defines the first portion VH1, and a second inner sidewall 102d of the carrier substrate 102 connected to the second surface 102b and the first inner sidewall 102c defines the second portion VH2. For example, the slope of the first inner sidewall 102c is substantially milder than the slope of the second inner sidewall 102d. In other words, the slope of the second inner sidewall 102d may be substantially steeper than the slope of the first inner sidewall 102c. In some embodiments, an obtuse angle θ1 measured between the first surface 102a and the first inner sidewall 102c is in a range of from greater than about 90 degrees to about 165 degrees. In some embodiments, an acute angle θ2 measured between the second surface 102b and the second inner sidewall 102d is in a range of from about 75 degrees to less than about 90 degrees. In some embodiments, an included angle θ12 between the first inner sidewall 102c and the second inner sidewall 102d is an obtuse angle (i.e. greater than 90 degrees). It should be noted that the last-mentioned values only serve as examples and may vary depending on the process and design requirements. For example, as compared to those via holes formed by using the fiber laser drilling operation, the angles θ1 and θ2 are substantially right angles to render substantially vertical inner sidewalls that define the via holes. As mentioned above, the vertical inner sidewalls may not be beneficial to the subsequent seed material deposition, and ultimately the plating operation; that is, the seed material may be formed with better conformity and better uniformity on the milder slope of the inner sidewalls.

Figure 1C:
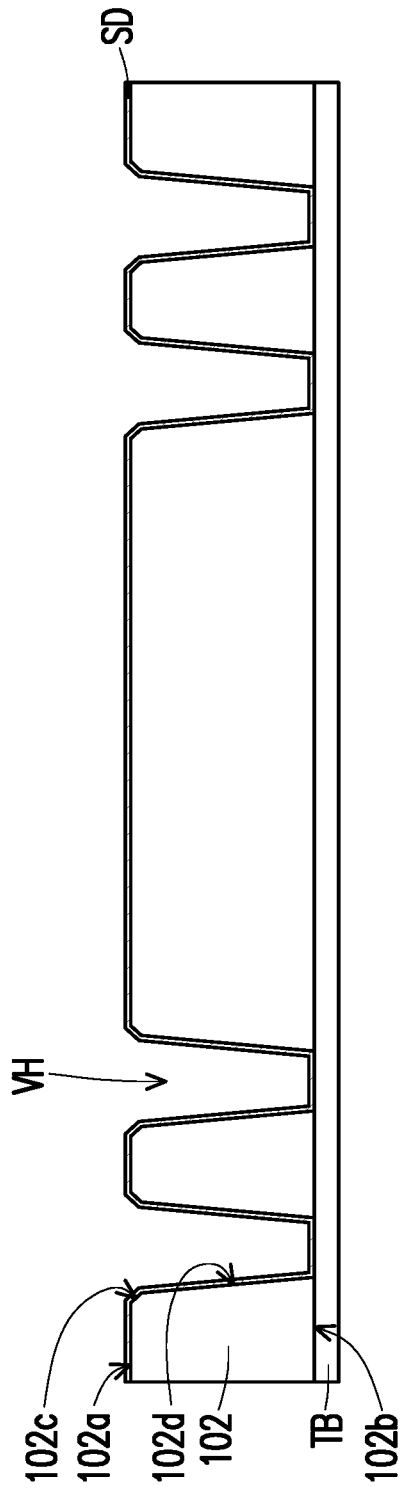

Referring to FIG. 1C, a seed material SD may be formed on the carrier substrate 102. The seed material SD may be a thin layer of a conductive material which aids in the formation of a thicker layer during the subsequent processing steps. In some embodiments, before forming the seed material SD, the second surface 102b of the carrier substrate 102 is attached to a temporary base layer TB for the subsequent processes. In some embodiments in which processing the second surface 102b of the carrier substrate 102 is initially performed, the first surface 102a of the carrier substrate 102 is attached to the temporary base layer TB. For example, the temporary base layer TB is (or include) a carrier tape for supporting the structure formed/disposed thereon.

In some embodiments, after attaching the carrier substrate 102 to the temporary base layer TB, the seed material SD is conformally formed on the carrier substrate 102 to cover the first surface 102a and the second surface 102b. The seed material SD may also formed in the via holes VH to line the first inner sidewall 102c and the second inner sidewall 102d. In some embodiments, a portion of the seed material SD is also formed on the temporary base layer TB which is accessibly revealed by the via holes VH. For example, the seed material SD is in direct contact with the carrier substrate 102 without any dielectric barrier layer interposed therebetween. Alternatively, a dielectric barrier layer (not shown) is formed prior to the formation of the seed material. In some embodiments, the seed material SD is a metal layer, which may be a single layer or a composite layer with multiple sub-layers formed of different materials. The seed material SD may be or may include a titanium layer and a copper layer over the titanium layer, and may be formed using a thin-film deposition such as physical vapor deposition (e.g., sputtering), evaporation, or any suitable technique. Alternatively, the formation of the seed material may be skipped as will be described later in other embodiments.

Figure 1D:
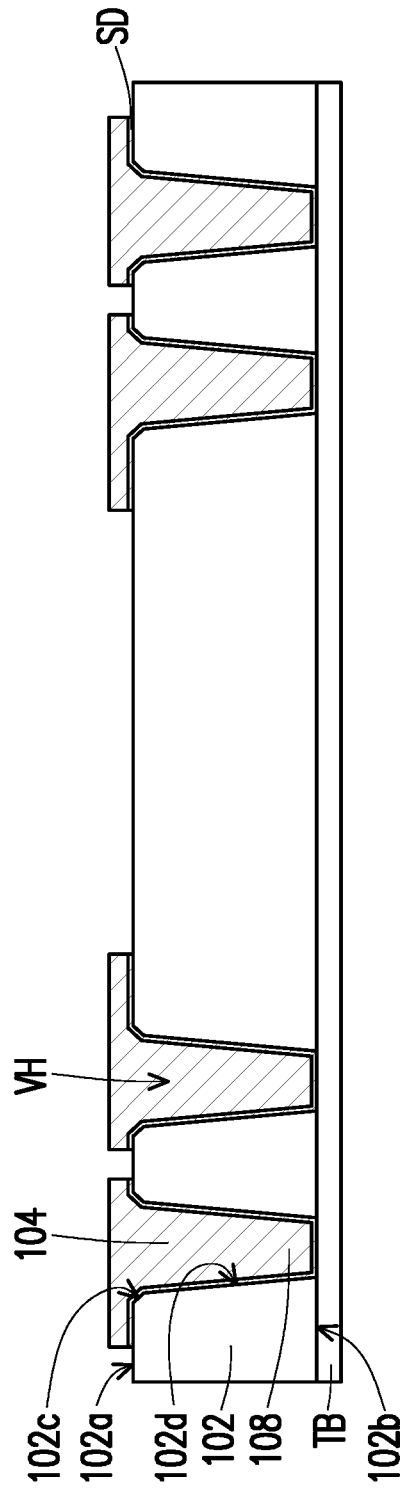

Referring to FIG. 1D and with continued reference to FIG. 1C, a conductive material may be formed on the seed material SD, and then a patterning process may be performed to form a first conductive pattern 104 and through substrate vias (TSVs) 108. In some embodiments, a photoresist (not shown) is formed and patterned on the seed material SD, where the photoresist may be formed and exposed to light for patterning. The patterning forms openings through the photoresist to expose portions of the seed material SD, where the openings in the photoresist may correspond to the via holes VH for forming the TSVs. Next, the conductive material may be formed in the openings of the photoresist and on the exposed portions of the seed material SD. For example, the conductive material includes a metal, such as copper, titanium, tungsten, aluminum, metal alloys, or the like, and the conductive material is formed by plating (e.g., electroplating or electroless plating), printing, or the like. In some embodiments, the conductive material fills the via holes VH and extend to cover the first surface 102a of the carrier substrate 102 which is accessibly exposed by the openings of the photoresist.

Next, the photoresist and portions of the seed material SD on which the conductive material is not formed may be removed. For example, the photoresist is removed by any suitable process such as ashing, stripping, or the like. In some embodiments, after the photoresist is removed, the exposed portions of the seed material SD that are not covered by the conductive material are removed by any suitable process such as wet etching, dry etching, or the like. As shown in FIG. 1D, the combination of the conductive material and underlying portions of the remaining seed material that is in the via holes VH may be viewed as the TSVs 108, and the combination of the conductive material and underlying portions of the remaining seed material that is on the TSV 108 and the first surface 102a may be viewed as the first conductive pattern 104. In some embodiments where the carrier substrate 102 is made of ceramic material, the TSVs 108 may be referred to as through ceramic vias.

For example, a finer line width of the first conductive pattern 104 may be achieved by using such lithography and plating processes. In some embodiments, the line width of the first conductive pattern 104 is in a range of about 5 μm and about 50 μm. It should be understood that depending on varying formation techniques that are employed to form the first conductive pattern, the line width may be different.

Figure 1E:
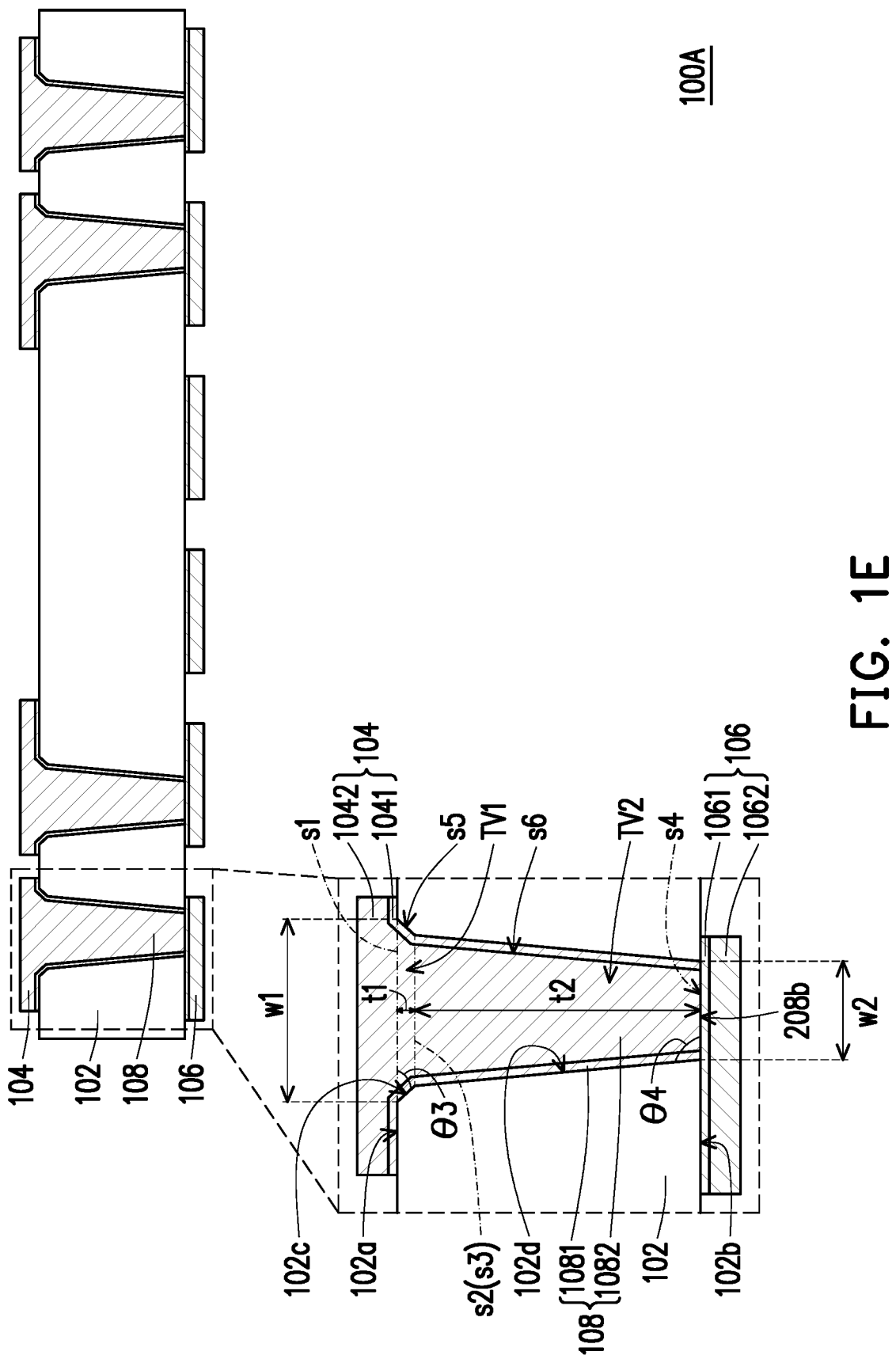

Referring to FIG. 1E and with continued reference to FIG. 1D, a second conductive pattern 106 may be formed on the second surface 102b of the carrier substrate 102 and connected to the TSVs 108, thereby forming a substrate structure 100A. For example, the temporary base layer TB is removed to accessibly expose the second surface 102b of the carrier substrate 102. In some embodiments, during the removal process of the temporary base layer TB, a portion of the seed material formed on the temporary base layer TB is also removed. For example, after removing the temporary base layer TB, the seed material may be formed on the second surface 102b of the carrier substrate 102, and then the conductive material is formed on the seed material. The seed material may be formed by physical vapor deposition (e.g., sputtering), evaporation, or any suitable technique. The conductive material may be formed by plating (e.g., electroplating or electroless plating), printing, or the like. Subsequently, portions of the conductive material and the seed material may be patterned to form the second conductive pattern 106 including a patterned conductive layer 1062 and a patterned seed layer 1061. For example, a finer line width of the second conductive pattern 106 may be achieved by using such lithography and plating processes. In some embodiments, the line width of the second conductive pattern 106 is in a range of about 5 μm and about 50 μm. Alternatively, the second conductive pattern 106 is formed by other suitable technique (e.g., printing or the like) to render different line width. Up to here, the fabrication of the substrate structure 100A is substantially complete.

As shown in FIG. 1E, the substrate structure 100A includes the carrier substrate 102, the first conductive pattern 104 formed on the first surface 102a of the carrier substrate 102, the second conductive pattern 106 formed on the second surface 102b of the carrier substrate 102, and the TSVs 108 penetrating through the carrier substrate 102 and electrically connecting the first conductive pattern 104 and the second conductive pattern 106. The respective TSV 108 includes the patterned seed layer 1081 and the patterned conductive layer 1082, where the patterned seed layer 1081 laterally covers the patterned conductive layer 1082 and is interposed between the carrier substrate 102 and the patterned conductive layer 1082.

Still referring to FIG. 1E and with reference to FIG. 1B, the respective TSV 108 may include the first portion TV1 and the second portion TV2 connected to the first portion TV1, where the first portion TV1 corresponds to the first portion VH1 of the via hole VH and the second portion TV2 corresponds to the second portion VH2 of the via hole VH. For example, the thickness t1 of the first portion TV1 is substantially less than the thickness t2 of the second portion TV2. Alternatively, the thickness of the first portion TV1 may be substantially equal to (or greater than) that of the second portion TV2. The cross-sectional profile of the first portion TV1 may possess an inverted trapezoidal shape having a virtual longer side s1 in proximity to the first surface 102a of the carrier substrate 102 and a virtual shorter side s2 opposite to the virtual longer side s1, where the virtual longer side s1 may be a virtual line on a virtual plane where the first surface 102a is located on. In some embodiments, the cross-sectional profile of the second portion TV2 is of an inverted trapezoidal shape having a virtual shorter side s4 in proximity to the second surface 102b of the carrier substrate 102 and a virtual longer side s3 opposite to the virtual shorter side s4 and equal to the virtual shorter side s2 of the first portion TV1, where the virtual shorter side s4 may be a virtual line on a virtual plane where the second surface 102b is located on.

In some embodiments, a lateral dimension (e.g., the width or the diameter) w1 of the virtual longer side s1 of the first portion TV1 is greater than the lateral dimension (e.g., the width or the diameter) w2 of the virtual short side s4 of the second portion TV2. For example, the lateral dimension w1 of the first portion TV1 is in a range of about 0.05 mm and about 0.5 mm, and the lateral dimension w2 of the second portion TV2 is in a range of about 0.01 mm and about 0.5 mm. In some embodiments, the first portion TV1 includes a sidewall s5 connected to the virtual longer side s1 and the virtual shorter side s2, and the second portion TV2 includes a sidewall s6 connected to the virtual longer side s3 and the virtual shorter side s4 and also connected to the sidewall s5 of the first portion TV1, where the slope of the sidewall s5 is substantially milder than the slope of the sidewall s6 of the second portion TV2. In other words, the slanted sidewall s6 is substantially steeper than the slanted sidewall s5. In some embodiments, an acute angle θ3 measured between the virtual longer side s1 and the sidewall s5 is in a range of from about 15 degrees to about less than 90 degrees. In some embodiments, an obtuse angle θ4 measured between the shorter side s4 and the sidewall s6 is in a range of from greater than about 90 degrees to about 105 degrees. It should be noted that the last-mentioned values only serve as examples and may vary depending on the process and design requirements.

With continued reference to FIG. 1E and also reference to FIGS. 1C-1D, the first conductive pattern 104 includes the patterned seed layer 1041 and the patterned conductive layer 1042 overlying the patterned seed layer 1041. For example, since the seed material is formed on the first surface 102a and in the via holes VH at the same step as shown in FIG. 1C, the patterned seed layer 1041 of the first conductive pattern 104 is continuously and physically connected to the patterned seed layer 1081 on the sidewall s5 of the first portion TV1. Similarly, the conductive material is formed in the via holes VH and on the first surface 102a at the same step as shown in FIG. 1D, the patterned conductive layer 1042 of the first conductive pattern 104 may be continuously and physically connected to the patterned conductive layer 1082 of the first portion TV1 without any visible interface formed therebetween. The second conductive pattern 106 includes the patterned seed layer 1061 and the patterned conductive layer 1062 underlying the patterned seed layer 1061. In some embodiments, the patterned seed layer 1061 of the second conductive pattern 106 is in physical and electrical contact with both of the patterned seed layer 1081 and the patterned conductive layer 1082 of the TSV 108.

Figure 2A:
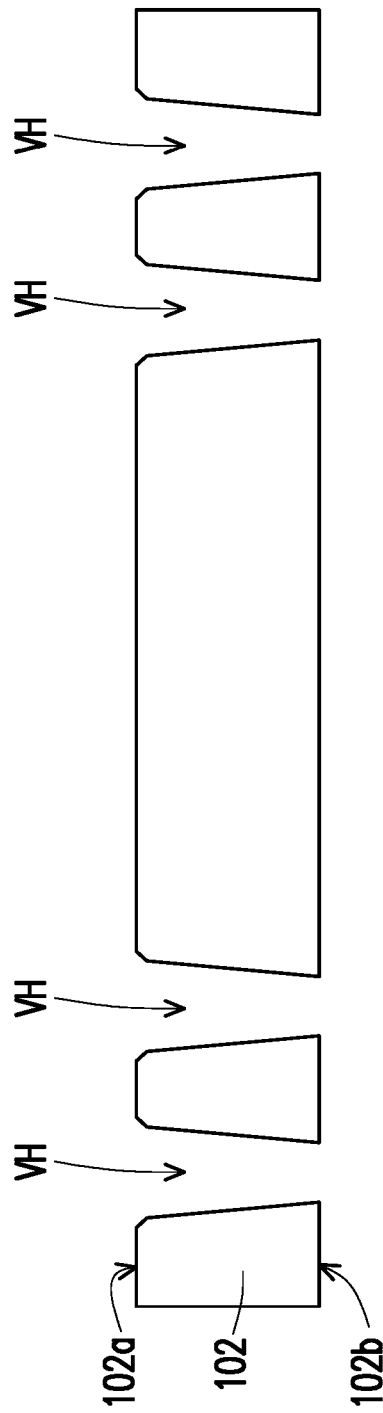
FIGS. 2A-2C are schematic cross-sectional views of various stages of manufacturing a substrate structure in accordance with some embodiments.
Figure 2B:
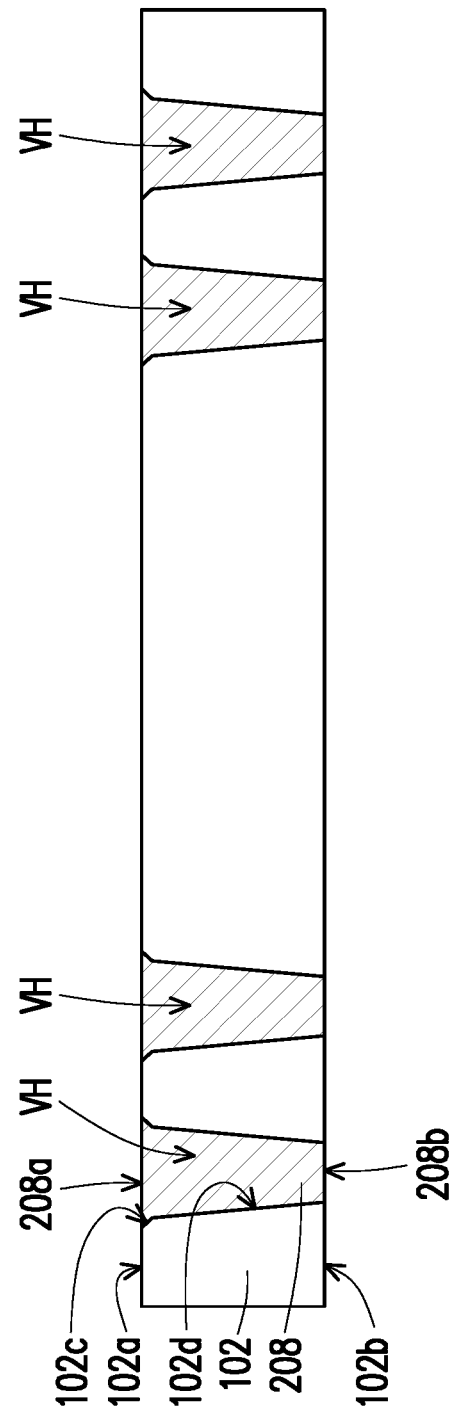
Figure 2C:
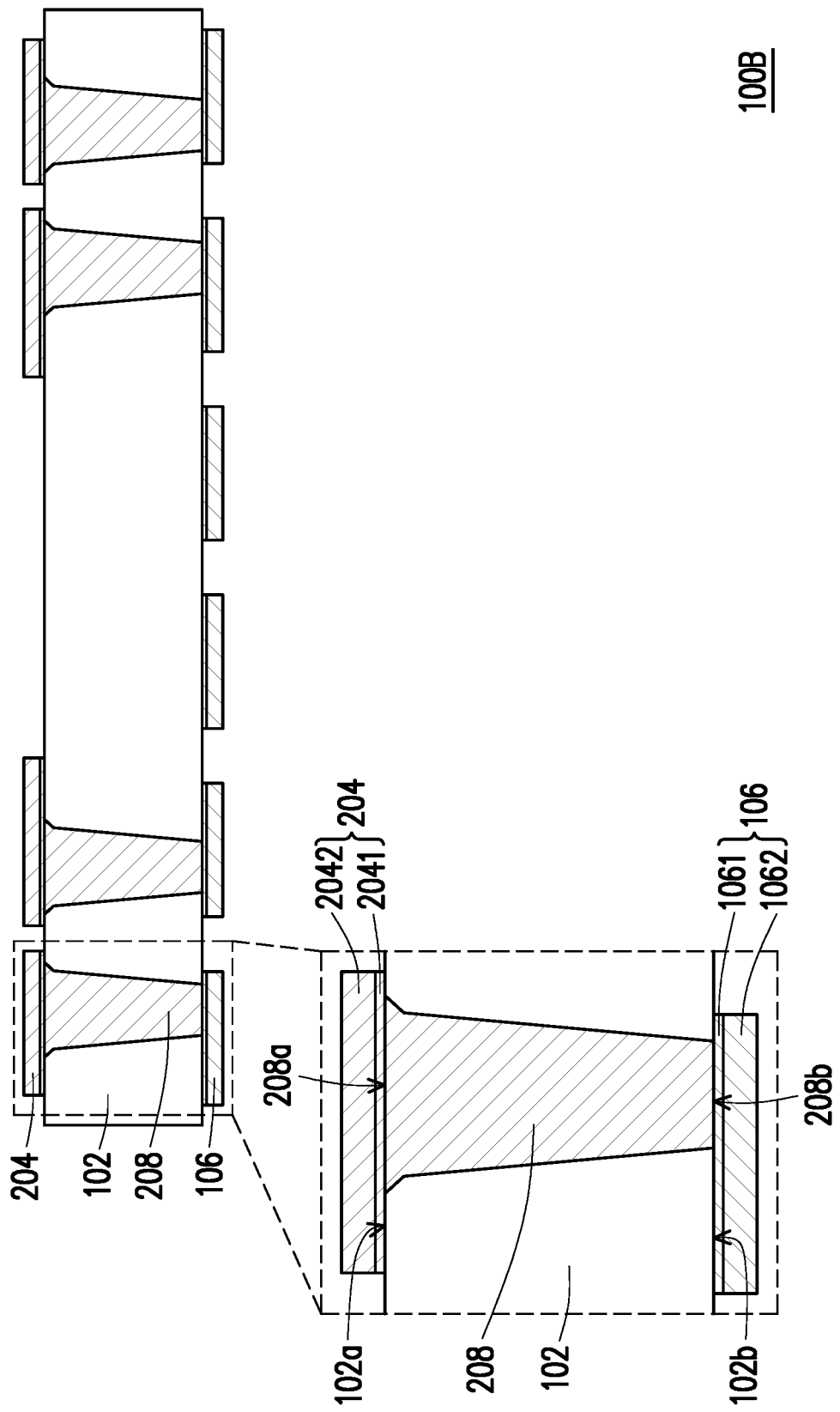

FIGS. 2A-2C are schematic cross-sectional views of various stages of manufacturing a substrate structure in accordance with some embodiments. Unless specified otherwise, the materials and the formation methods of the components in these embodiments are essentially the same as the like components, which are denoted by like reference numerals in the embodiments shown in FIGS. 1A-1E. The details regarding the formation process and the materials of the components shown in FIGS. 2A-2C may thus be found in the discussion of the embodiments shown in FIGS. 1A-1E. Referring to FIG. 2A, the carrier substrate 102 with the via holes VH is provided. The carrier substrate 102 shown in FIG. 2A is similar to the carrier substrate 102 shown in FIG. 1B, and the details of the via holes VH may refer to the preceding paragraphs.

Referring to FIG. 2B, once the via holes VH are formed, each of the TSVs 208 may be formed in one of the via holes VH. In some embodiments, the TSVs 208 are formed by using a printing process. A printing tool (e.g., squeegee, blade, or wiper) may brush across and over the carrier substrate 102 back and forth to apply a conductive paste in the via holes VH. For example, the conductive paste includes the mixture of conductive particles and binder, where the conductive particles may be or may include copper, silver, metal alloy, and/or the like. In some embodiments, before performing the paste printing, a stencil having apertures (not shown) is disposed on the first surface 102a (and/or the second surface 102b) of the carrier substrate 102a, where the apertures of the stencil may correspond to the via holes VH. After the conductive paste is formed in the apertures and the via holes VH, the stencil may be removed. Alternatively, the stencil is omitted, and the conductive paste is directly applied to the first surface 102a (and/or the second surface 102b) of the carrier substrate 102a, and then excess conductive paste on the first surface 102a (and/or the second surface 102b) may be removed to form the conductive paste in the via holes VH.

In some embodiments, a curing process is performed to solidify the conductive paste, thereby forming the TSVs 208 in the via holes VH. Alternatively, the curing process may be skipped. In some embodiments, a planarization process (e.g., chemical-mechanical polishing (CMP), grinding, etching, a combination thereof, and/or the like) is performed at least on the conductive paste, so that the first surface 208a and the second surface 208b of the respective TSV 208 may be substantially leveled with the first surface 102a and the second surface 102b of the carrier substrate 102, respectively. As compared to using the plating process to form the TSVs, when using the paste printing process to form the TSVs 208, the deposition of seed material may be skipped. For example, the conductive paste is in direct contact with the first inner sidewall 102c and the second inner sidewall 102d of the carrier substrate 102.

Referring to FIG. 2C, the first conductive pattern 204 and the second conductive pattern 106 are respectively formed on the first surface 102a and the second surface 102b of the carrier substrate 102. Up to here, the fabrication of the substrate structure 100B is substantially complete. For example, the second conductive pattern 106 includes the patterned seed layer 1061 physically connecting the second surface 208b of the respective TSV 208 and extending to be disposed on the second surface 102b of the carrier substrate 102, and the patterned conductive layer 1062 underlying the patterned seed layer 1061. The first conductive pattern 204 may include the patterned seed layer 2041 overlying the first surface 208a of the respective TSV 208 and extending to be disposed on the first surface 102a of the carrier substrate 102, and the patterned conductive layer 2042 overlying the patterned seed layer 2041. As compared to the TSV 108 shown in FIG. 1E, the TSV 208 is free of seed material, and the patterned seed layer 2041 of the first conductive pattern 204 is in physical and electrical contact with the entire first surface 208a of the TSV 208. Alternatively, the first conductive pattern 204 and/or the second conductive pattern 106 may be formed by printing and may be free of the patterned seed layer.

Figure 3A:
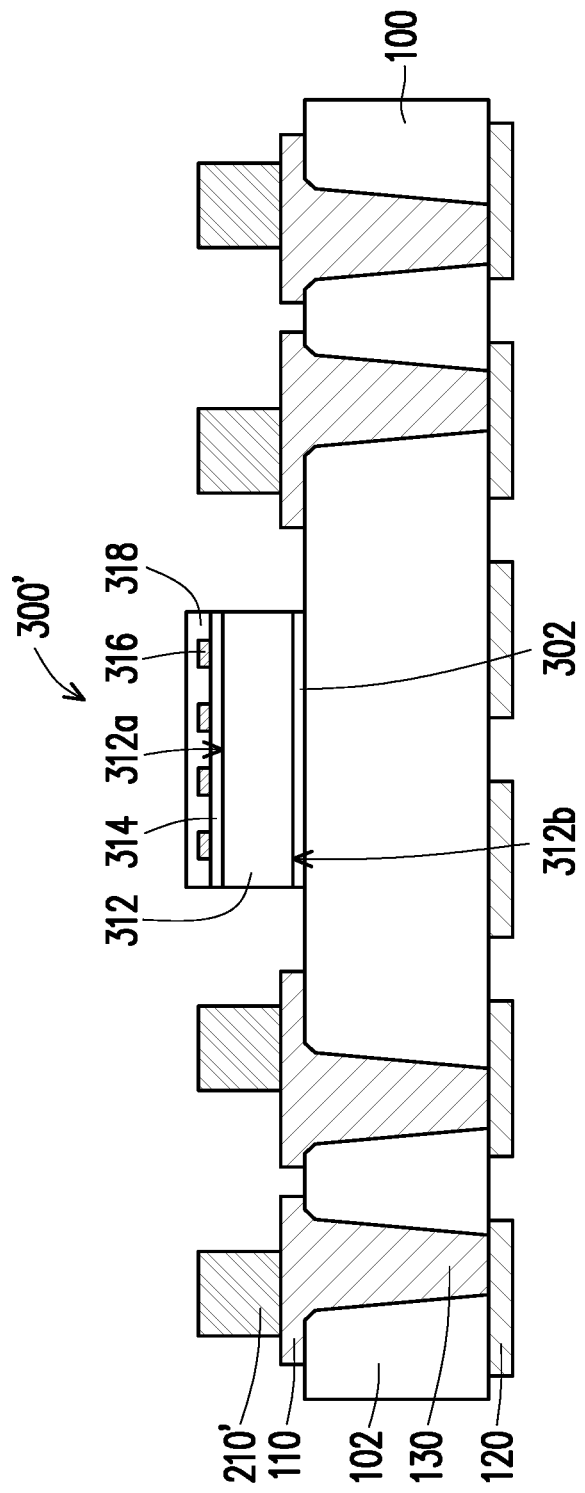
FIGS. 3A-3C are schematic cross-sectional views of various stages of manufacturing a semiconductor package including a substrate structure in accordance with some embodiments.
Figure 3B:
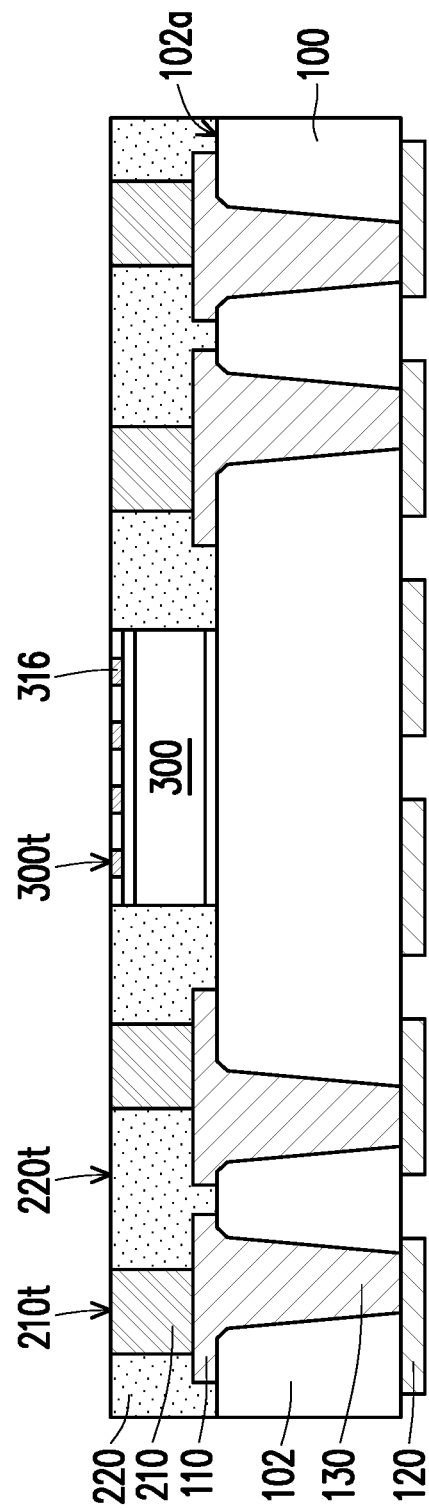
Figure 3C:
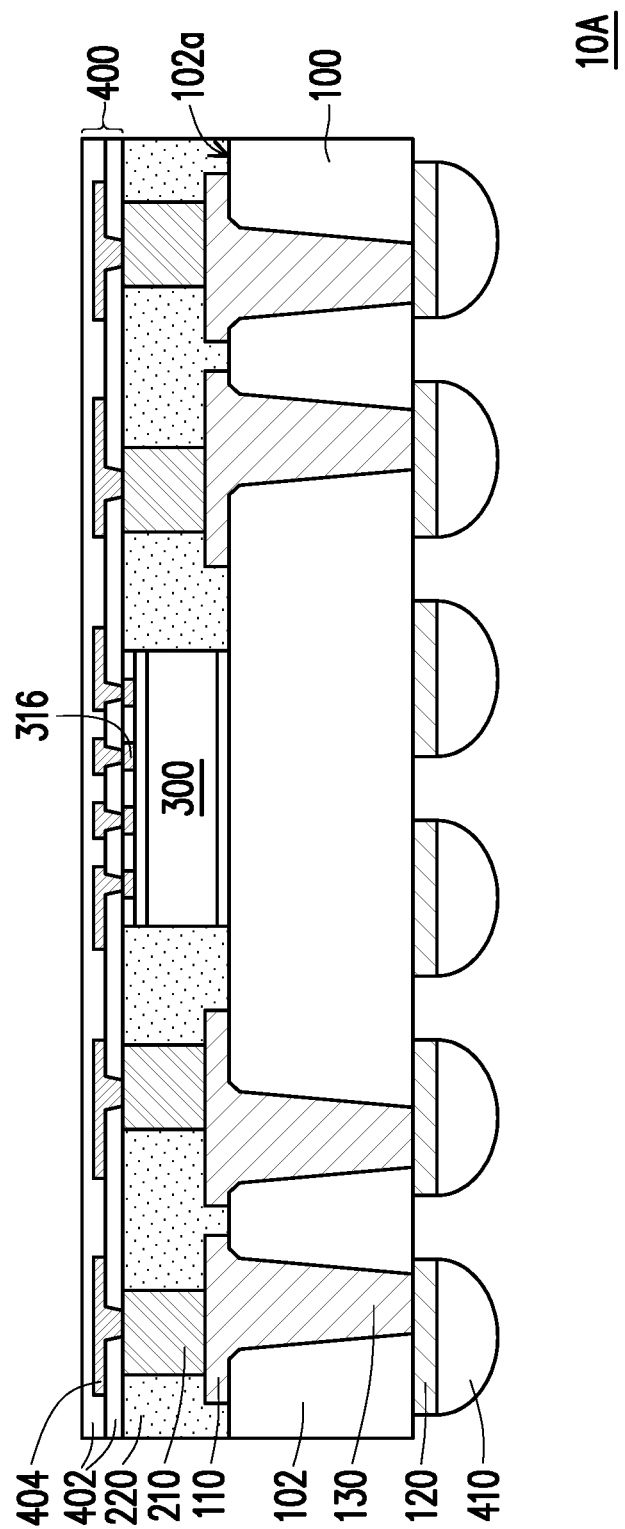

FIGS. 3A-3C are schematic cross-sectional views of various stages of manufacturing a semiconductor package including a substrate structure in accordance with some embodiments. Throughout the various views and illustrative embodiments of the present invention, like reference numbers are used to designate like elements. Referring to FIG. 3A, the substrate structure 100 including the carrier substrate 102, the first conductive pattern 110, the second conductive pattern 120, and the TSVs 130 is provided. The substrate structure 100 may be the substrate structure 100A shown in FIG. 1E or may be the substrate structure 100B shown in FIG. 2C. For example, the first conductive pattern 110 is similar to the first conductive pattern 104 (or 204), the second conductive pattern 120 is similar to the second conductive pattern 106, and the TSVs 130 are similar to the TSVs 108 (or 208). It is noted that the patterned seed layer is not illustrated for simplification, and the substrate structures described above are merely examples, variations thereof may be carried out while still remaining within the scope of the claims and disclosure.

In some embodiments, a plurality of conductive pillars 210' may be formed on the substrate structure 100, and a semiconductor die 300' may be disposed on the substrate structure 100. For example, the conductive pillars 210' are formed on the first conductive pattern 104 by plating, such as electroplating or electroless plating, or the like. In some embodiments, the semiconductor die 300' is surrounded by the first conductive pattern 104 on the carrier substrate 102 and may be surrounded by the conductive pillars 210'. In some embodiments, the semiconductor die 300' is attached to the first surface 102a of the carrier substrate 102 through a die attach film (DAF) 302. For example, the formation of the conductive pillars 210' is performed prior to the placement of the semiconductor die 300'. It should be noted that the single die is shown for illustrative purposes only, and one or more semiconductor die may be disposed on the substrate structure 100 depending on product requirements. The semiconductor die 300' may be or may include logic die (e.g., central processing unit (CPU) die, graphics processing unit (GPU) die, system-on-a-chip (SoC), application processor (AP), microcontroller, etc.), a memory die (e.g., dynamic random access memory (DRAM) die, static random access memory (SRAM) die, etc.), a power management die, a radio frequency (RF) die, a sensor die, a micro-electro-mechanical-system (MEMS) die, a signal processing die (e.g., digital signal processing (DSP) die), a front-end die (e.g., analog front-end (AFE) dies), combinations thereof, and/or the like.

With continued reference to FIG. 3A, the semiconductor die 300' may include a semiconductor substrate 312, an interconnect structure 314 disposed over the semiconductor substrate 312, a plurality of die connectors 316 disposed on and electrically connected to the interconnect structure 314, and a protection layer 318 disposed over the interconnect structure 314 and covering the die connectors 316. The semiconductor substrate 312 may be or may include a silicon substrate including active components (e.g., transistors, or the like) and passive components (e.g., resistors, capacitors, inductors, or the like) formed therein. For example, the semiconductor substrate 312 includes a rear surface 312b and a front surface 312a opposite to each other, where the interconnect structure 314 is formed over the front surface 312a and the DAF 302 is attached to the rear surface 312b. The interconnect structure 314 may include metal lines and vias embedded in dielectric layers, where the metal lines and vias may interconnect the active/passive components and/or provide electrical routing and connection between the die connectors 316. The protection layer 318 may be or may include polyimide (PI), polybenzoxazole (PBO), benzocyclobutene (BCB), a combination thereof, and/or any suitable dielectric material. In some embodiments, at this stage, the die connectors 316 are encapsulated by the protection layer 318 for protection. It is noted that the semiconductor die shown herein is merely an example, and the drawings may not depict all of the components of the semiconductor die.

Referring to FIG. 3B and also reference to FIG. 3A, an insulating encapsulation 220 is formed over the substrate structure 100. For example, an insulating material is formed on the first surface 102a of the carrier substrate 102 to cover the conductive pillars 210' and the semiconductor die 300'. The insulating material may be formed of a molding compound, epoxy, or the like, and may be applied by compression molding, transfer molding, or the like. For example, the insulating material is applied in liquid or semi-liquid form and subsequently cured. In some embodiments, a planarization process (e.g., CMP, grinding, etching, combination of these, etc.) is performed on the insulating material to form the insulating encapsulation 220. In some embodiments, during the planarization, a portion of the protection layer 318 of the semiconductor die 300' is removed to accessibly reveal the die connectors 316 for further connection. For example, after the planarization, the semiconductor die 300 includes the die connectors 316 laterally covered by the protection layer 318, and at least top surfaces of the die connectors 316 are accessibly exposed by the protection layer 318. In some embodiments, the conductive pillars 210' may be (or may not be) ground during the planarization. For example, during the planarization, the insulating material covering the top of the conductive pillars 210' may be removed. The conductive pillars 210' laterally covered by the insulating encapsulation 220 may be referred to as through insulating vias (TIVs) 210. In some embodiments, the top surface 210t of the insulating encapsulation 220, the top surface 300t of the semiconductor die 300, and the top surfaces 210t of the TIVs 210 are substantially level (e.g., planar) within process variations.

Referring to FIG. 3C, a redistribution structure 400 is formed on the semiconductor die 300, the TIVs 210, and the insulating encapsulation 220. For example, the semiconductor die 300 is electrically coupled to the TIVs 210 through the redistribution structure 400. In some embodiments, the redistribution structure 400 includes at least one dielectric layer 402 and at least one patterned conductive layer 404 alternately stacked on the dielectric layer 402. It should be appreciated that the number of the dielectric layer 402 and the number of the patterned conductive layer 404 are based on the circuit design requirements and construe no limitation in the disclosure. The patterned conductive layer 404 may include conductive features such as conductive lines, conductive vias, and/or conductive pads, and may be formed by patterning and metallization techniques (e.g., lithography, etching, CMP, thin-film deposition, plating, damascene processing, etc.) or any suitable process. The patterned conductive layer 404 may be physically and electrically connected to the die connectors 316 of the semiconductor die 300 and the TIVs 210. The material of the patterned dielectric layer 402 may include one or more photo-sensitive material(s) such as PBO, PI, BCB, a combination thereof, or the like. The material of the patterned conductive layer 404 may include copper, nickel, titanium, a combination thereof, or the like.

With continued reference to FIG. 3C, a plurality of external terminals 410 may be formed on the substrate structure 100. For example, the external terminals 410 are electrically coupled to the semiconductor die 300 through the substrate structure 100, the TIVs 210, and the redistribution structure 400. The external terminals 410 may include conductive material(s) such as solder, copper, aluminum, gold, nickel, silver, palladium, tin, metal alloy, the like, or a combination thereof. For example, the external terminals 410 include ball grid array (BGA) connectors, solder balls, metal pillars, controlled collapse chip connection (C4) bumps, electroless nickel-electroless palladium-immersion gold (ENEPIG) formed bumps, or the like. In some embodiments, the external terminals 410 are formed by initially forming a layer of reflowable material on the second conductive pattern 120 of the substrate structure 100 through ball placement, evaporation, electroplating, printing, solder transfer, or the like. Once a layer of reflowable material has been formed on the second conductive pattern 120, a reflow may be performed to shape the material into the desired bump shapes.

In some embodiments, after forming the external terminals 410, a singulation process is performed to cut off the redistribution structure 400, the insulating encapsulation 220, and the carrier substrate 102 of the substrate structure 100. For example, the conterminous sidewalls of the redistribution structure 400, the insulating encapsulation 220, and the carrier substrate 102 are formed after the singulation. Up to here, the fabrication of a semiconductor package 10A is substantially complete. The semiconductor package 10A includes the carrier substrate 102 which may be tailored to provide a desired material property such as enhanced thermal conductivity, thereby facilitating heat dissipation. Moreover, by using the selected laser drilling process to form the via holes in the carrier substrate 102, the more reliable TSVs 130 may be formed in the carrier substrate 102, and the overall reliability and the electrical performance of the semiconductor package 10A may be improved. In some embodiments, additional package structure may be disposed on the redistribution structure 400 to form a package-on-package (PoP) structure. Other types of the package/semiconductor structure may be possible.

Figure 4:
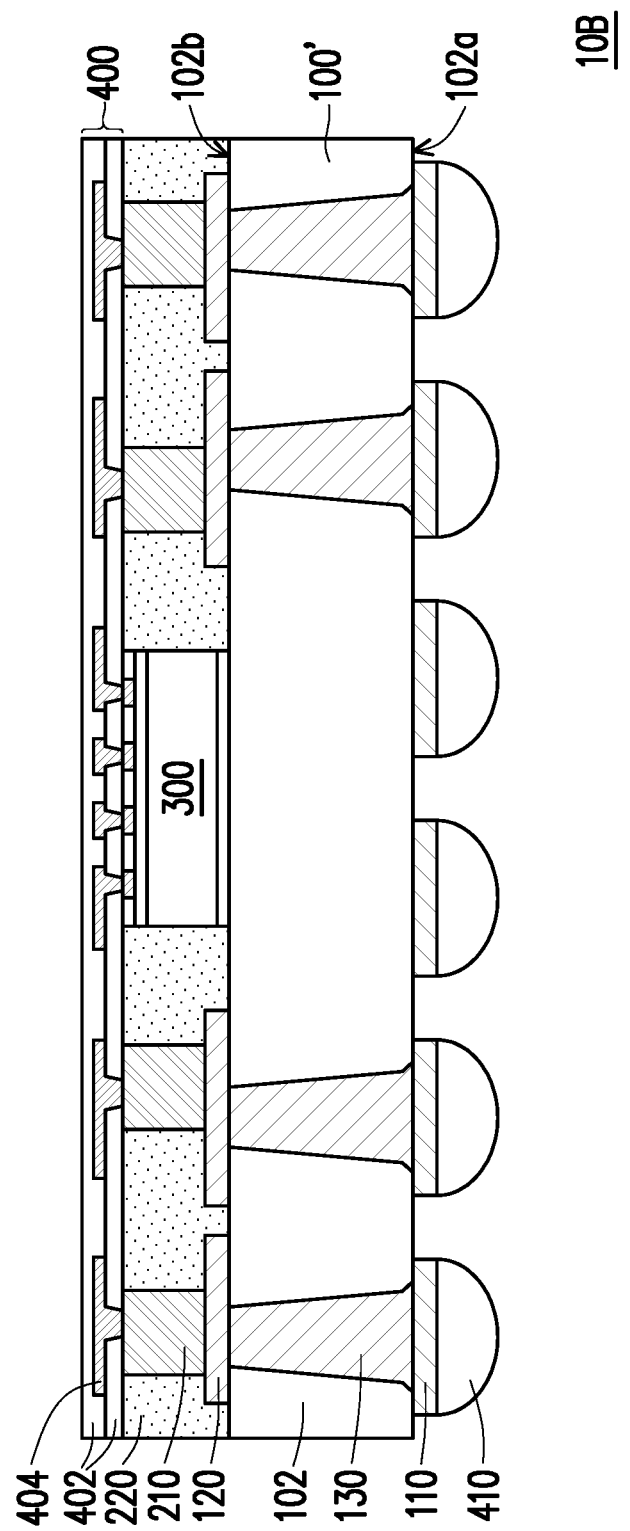
FIG. 4 is a schematic cross-sectional view of a semiconductor package including a substrate structure in accordance with some embodiments.

FIG. 4 is a schematic cross-sectional view of a semiconductor package including a substrate structure in accordance with some embodiments. The semiconductor package 10B is similar to the semiconductor package 10A shown in FIG. 3C. Unless specified otherwise, the materials and the formation methods of the components in these embodiments are essentially the same as the like components, which are denoted by like reference numerals in the embodiments shown in FIG. 3C. The details regarding the materials of the components may thus be found in the discussion of the embodiments shown in FIGS. 3A-3C.

Referring to FIG. 4, the difference between the semiconductor packages 10A and 10B includes that the semiconductor package 10B includes the TSVs 130 of the substrate structure 100' that are substantially tapered from the external terminals 410 toward the TIVs 210. For example, the TIVs 210, the semiconductor die 300, and the insulating encapsulation 220 are formed over the second surface 102b of the carrier substrate 102, and the external terminals 410 are formed on the first conductive pattern 110 on the first surface 102a of the carrier substrate 102. In some embodiments, the respective external terminal 410 is coupled to the first conductive pattern 110 which is in physical contact with the wider portion of the respective TSV 130. The respective TIV 210 may be coupled to the second conductive pattern 110 which is in physical contact with the narrower portion of the respective TSV 130.

Figure 5:
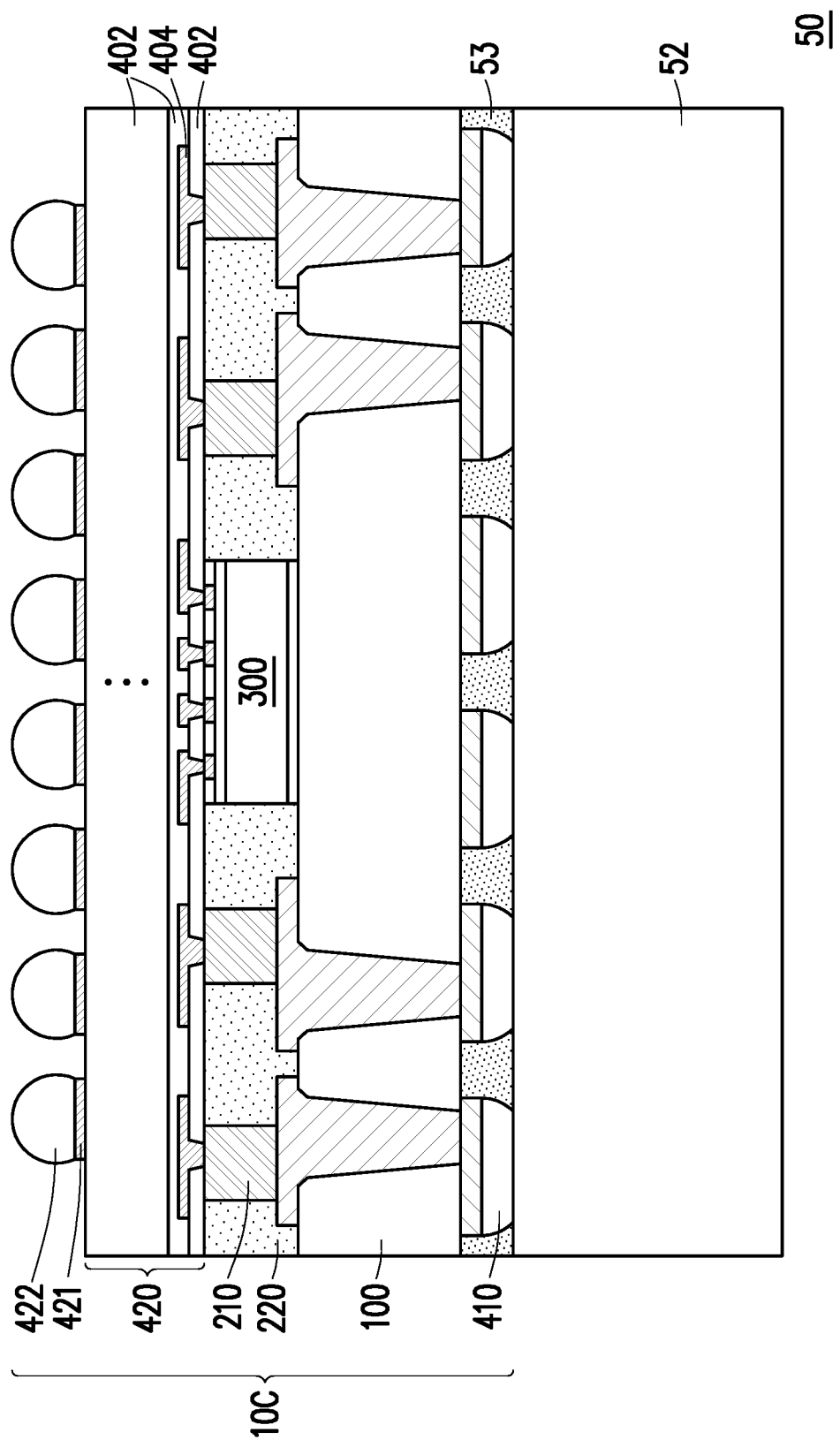
FIG. 5 is a schematic cross-sectional view of a package structure including a semiconductor package in accordance with some embodiments.

FIG. 5 is a schematic cross-sectional view of a package structure including a semiconductor package in accordance with some embodiments. Like elements in throughout the drawings are designated with the same reference numbers for ease of understanding and the details thereof are not repeated herein. It should be noted that FIG. 5 may not depict all of the components of a given structure. Referring to FIG. 5, the package structure 50 includes the top package 10C and a bottom package 52 electrically coupled to the top package 10C. For example, the top package 10C is similar to the semiconductor package 10A except the redistribution structure 420. The formation and materials of the redistribution structure 420 may be similar to the redistribution structure 400, so the detailed descriptions are not repeated for simplicity. In some embodiments, the redistribution structure 420 includes multiple dielectric layers 402 and multiple patterned conductive layers 404, and conductive terminals 422 are formed on the redistribution structure 420. In some embodiments, the substrate structure 100 of the top package 10C may be similar to the substrate structure 100 described in FIG. 1E or the substrate structure 100' described in FIG. 2C. In some embodiments, the top package 10C is replaced with the semiconductor package 10B or other semiconductor package(s)/structure(s) described elsewhere in the disclosure.

In some embodiments, the outermost patterned conductive layer 421 includes conductive pads for the conductive terminals 422 formed thereon. Alternatively, the outermost patterned conductive layer 421 and/or the conductive terminals 422 may be omitted. The conductive terminals 422 may be or may include micro-bumps, metal pillars, solder balls, ENEPIG formed bumps, C4 bumps, BGA bumps, or the like. In some embodiments, the top package 10C is attached to the bottom package 52. For example, attaching the top package 10C includes placing the external terminals 410 on the bottom package 52 and reflowing the external terminals 410 to physically and electrically couple the top package 10C and the bottom package 52. The bottom package 52 may be or may include a semiconductor package including a device die, an interposer, a substrate and/or the like. In such embodiments, the package structure 50 is referred to as the PoP structure. In some embodiments, the bottom package 52 includes a package substrate, a printed circuit board (PCB), a wiring board, or another types of package component. In some embodiments, an underfill layer 53 is formed in the gap between the top package 10C and the bottom package 52. The underfill layer 53 may include, for example, an epoxy polymer or any suitable dielectric material. Alternatively, the underfill layer 53 is omitted.

Figure 6:
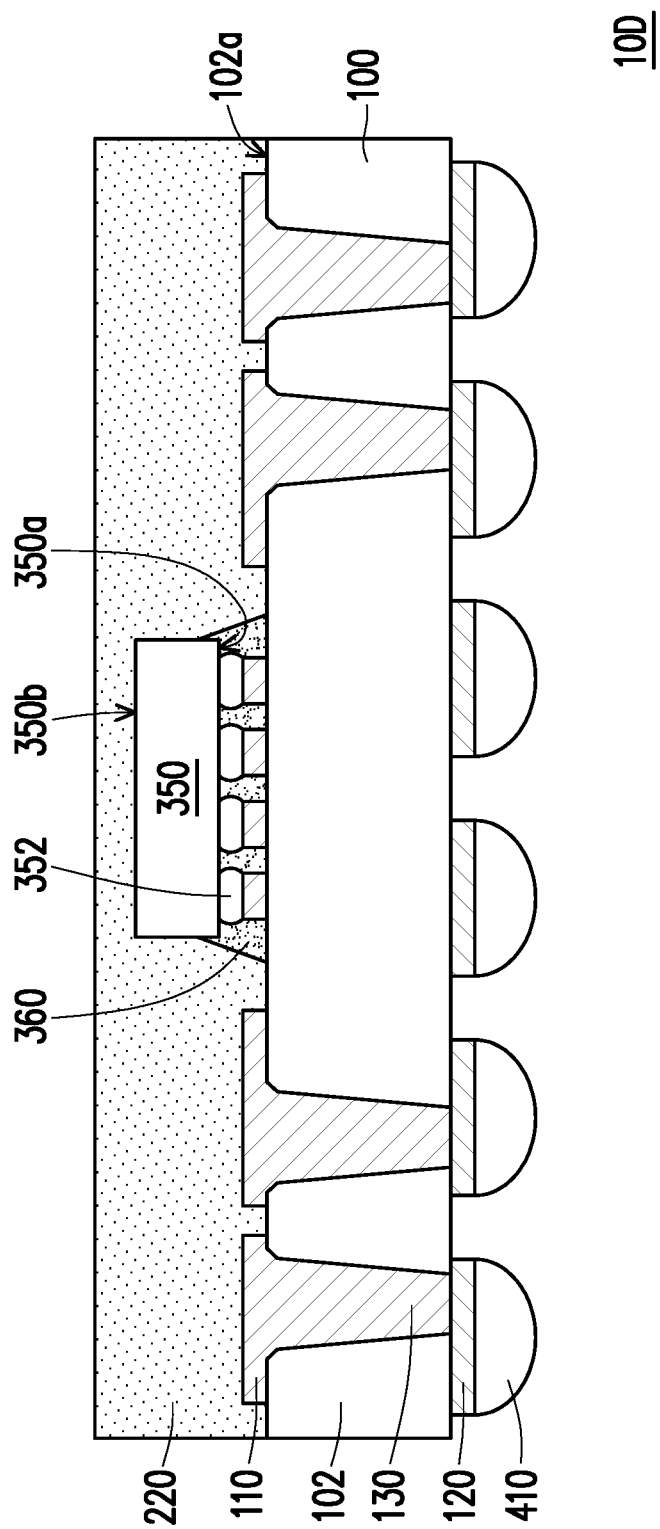
FIG. 6 is a schematic cross-sectional view of a semiconductor package including a substrate structure in accordance with some embodiments.

FIG. 6 is a schematic cross-sectional view of a semiconductor package including a substrate structure in accordance with some embodiments. Like elements in throughout the drawings are designated with the same reference numbers for ease of understanding and the details thereof are not repeated herein. It should be noted that FIG. 6 may not depict all of the components of a given structure. Referring to FIG. 6, a semiconductor package 10D includes the substrate structure 100, a semiconductor die 350 mounted on the substrate structure 100, and an insulating encapsulation 220 disposed on the substrate structure 100 and covering the semiconductor die 350. For example, the substrate structure 100 is similar to the substrate structure 100A shown in FIG. 1E. In some embodiments, the substrate structure 100 is replaced with the substrate structure 100B shown in FIG. 2C or the substrate structure 100' shown in FIG. 4. In some embodiments, the external terminals 410 are formed on the second conductive pattern 120 of the substrate structure 100 for further electrical connection, and the semiconductor die 350 is disposed on the first conductive pattern 110 of the substrate structure 100.

In some embodiments, the semiconductor die 350 is attached to the first conductive pattern 110 by using a flip-chip bonding process. For example, the semiconductor die 350 includes an active side 350*a* and a rear side 350*b* opposite to each other, where the active side 350*a* is mounted in an upside-down fashion over the substrate structure 100. The semiconductor die 350 may be or may include a logic die, a memory die, a power management die, a RF die, a sensor die, a MEMS die, a signal processing die, a front-end die, the like, or combinations thereof. In some embodiments, a plurality of conductive bumps 352 of the semiconductor die 350 is in physical and electrical contact with the first conductive pattern 110. For example, the semiconductor die 350 is secured to the substrate structure 100 by the conductive bumps 352. In some embodiments, bonding the semiconductor die 350 includes placing the conductive bumps 352 on the first conductive pattern 110 and reflowing the conductive bumps 352 to physically and electrically connect the semiconductor die 350 and the substrate structure 100. Although the conductive bumps 352 are employed to couple the semiconductor die 350 to the substrate structure 100, it is understood that any mechanism for coupling the semiconductor die to the substrate structure are within the scope of the present disclosure.

In some embodiments, to improve the reliability of electrical connections in the flip-chip package, an underfill layer 360 is formed in the gap between the semiconductor die 350 and the substrate structure 100 to cover the conductive terminals 352 and the underlying first conductive pattern 110. In some embodiments, the underfill layer 360 extends to cover the sidewalls of the semiconductor die 350. For example, the underfill layer 360 has a high tensile modulus to protect the semiconductor die 350 from damage. Alternatively, the underfill layer 360 is omitted. In some embodiments, the insulating encapsulation 220 is formed on the first surface 102*a* of the substrate structure 100 and covers the first conductive pattern 110, the underfill layer 360, and the semiconductor die 350. For example, the insulating encapsulation 220 covers the sidewalls and the rear side 350*b* of the semiconductor die 350. Alternatively, the rear side 350*b* of the semiconductor die 350 is accessibly exposed by the insulating encapsulation 220, thereby improving the heat-dissipation efficiency of the semiconductor package 10D.

Figure 7:
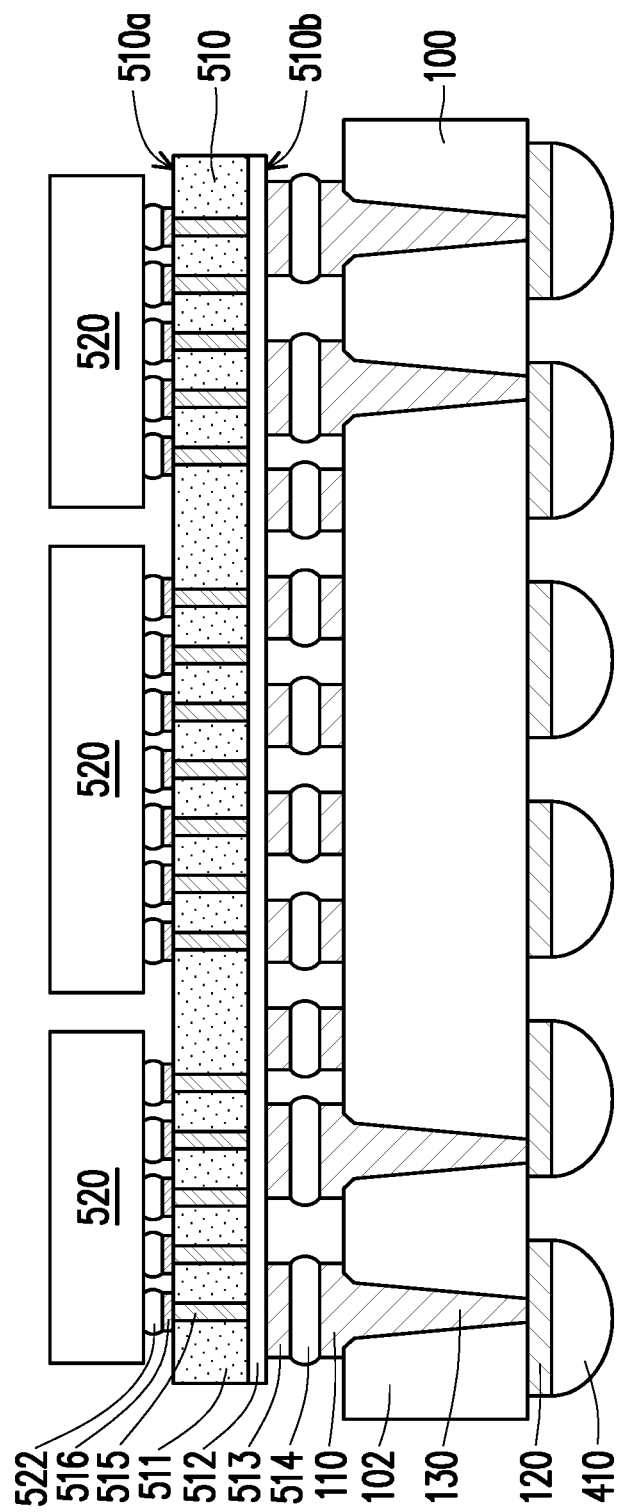
FIG. 7 is a schematic cross-sectional view of a semiconductor structure including a substrate structure in accordance with some embodiments.

FIG. 7 is a schematic cross-sectional view of a semiconductor structure including a substrate structure in accordance with some embodiments. Like elements in throughout the drawings are designated with the same reference numbers for ease of understanding and the details thereof are not repeated herein. It should be noted that FIG. 7 may not depict all of the components of a given structure. Referring to FIG. 7, a semiconductor structure 60 includes the substrate structure 100, an interposer 510 disposed on the substrate structure 100, and one or more semiconductor die 520 disposed on the interposer 510. The substrate structure 100 may be similar to the substrate structure 100A shown in FIG. 1E. Alternatively, the substrate structure 100 is replaced with the substrate structure 100B shown in FIG. 2C or the substrate structure 100' shown in FIG. 4. In some embodiments, the external terminals 410 are formed on the second conductive pattern 120 of the substrate structure 100 for further electrical connection, and the semiconductor dies 520 are disposed on and electrically connected to the interposer 510. The semiconductor dies 520 may be or may include logic dies, memory dies, power management dies, RF dies, sensor dies, MEMS dies, signal processing dies, front-end dies, combinations thereof, or any suitable type of device dies.

In some embodiments, the interposer 510 includes the first side 510*a* and the second side 510*b* opposite to each other, where the semiconductor dies 520 are mounted on the first side 510*a*, and the substrate structure 100 may be disposed below the second side 510*b*. For example, the interposer 510 includes a semiconductor substrate 511, an interconnect structure 512 disposed at the second side 510*b*, a plurality of conductive pads 513 connecting to the interconnect structure 512, and conductive bumps 514 connecting to the conductive pads 513 and the first conductive pattern 110. In some embodiments, the interposer 510 includes through vias 515 penetrating through the semiconductor substrate 511 and electrically coupled to the interconnect structure 512, and a plurality of conductive pads 516 disposed at the first side 510*a* for connecting the conductive bumps 522 of the semiconductor dies 520.

In some embodiments, as compared to the TSVs 130 of the substrate structure that are formed by using the laser drilling operation, the through vias 515 of the interposer 510 may be formed by such as etching or other suitable process. For example, the sidewall of the respective through via 515 is substantially vertical, as compared to the sidewalls of the TSVs 130. The underfill layer (not shown) is optionally formed in the gap between the first side 510*a* of the interposer 510 and the semiconductor dies 520 to cover the conductive bumps 522. The underfill layer may be formed in the gap between the second side 510*b* of the interposer and the substrate structure 100 to cover the connections therebetween. It should be understood that the semiconductor structure 60 shown herein is merely an example, and variations thereof may be carried out while still remaining within the scope of the claims and disclosure.

In accordance with some embodiments, a semiconductor package includes a carrier substrate, a through substrate via (TSV), a first conductive pattern, and an encapsulated die. The TSV penetrates through the carrier substrate and includes a first portion and a second portion connected to the first portion, the first portion includes a first slanted sidewall with a first slope, the second portion includes a second slanted sidewall with a second slope, and the first slope is substantially milder than the second slope. The first conductive pattern is disposed on the carrier substrate and connected to the first portion of the TSV. The encapsulated die is disposed on the carrier substrate and electrically coupled to the TSV through the first conductive pattern.

In accordance with some embodiments, a semiconductor package includes a substrate structure, a semiconductor die, and an insulating encapsulation disposed on the substrate structure and encapsulating the semiconductor die. The substrate structure includes a ceramic substrate, a through substrate via (TSV), and a first conductive pattern disposed on the ceramic substrate and connected to the TSV. The ceramic substrate includes a first surface, a first inner sidewall connected to the first surface, a second surface opposite to the first surface, and a second inner sidewall connected to the first inner sidewall and the second surface, where an obtuse angle is between the first inner sidewall and the second inner sidewall. The TSV penetrates through the ceramic substrate and is in contact with the first inner sidewall and the second inner sidewall. The first conductive pattern is disposed on the ceramic substrate and connected to the TSV, and the semiconductor die is disposed on the substrate structure and electrically coupled to the TSV through the first conductive pattern.

In accordance with some embodiments, a manufacturing method of a semiconductor package includes at least the following steps. A carrier substrate with a via hole is formed, where after the via hole is formed, the carrier substrate includes a first inner sidewall and a second inner sidewall connected to the first inner sidewall, and an obtuse angle is formed between the first inner sidewall and the second inner sidewall. A through substrate via (TSV) is formed in the via hole of the carrier substrate, and a conductive pattern is formed on the carrier substrate and overlying the TSV. A semiconductor die is disposed on the carrier substrate, where the semiconductor die is surrounded by the conductive pattern. An insulating encapsulation is formed on the carrier substrate to cover the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a carrier substrate;
   a through substrate via (TSV) penetrating through the carrier substrate, and the TSV comprising:
   a first portion comprising a first slanted sidewall with a first slope;
   a second portion connected to the first portion and comprising a second slanted sidewall with a second slope, and the first slope being substantially milder than the second slope;
   a first conductive pattern disposed on the carrier substrate and connected to the first portion of the TSV, and comprising a first patterned seed layer and a first patterned conductive layer overlying the first patterned seed layer; and
   an encapsulated die disposed on the carrier substrate and electrically coupled to the TSV through the first conductive pattern.

2. The semiconductor package of claim 1, wherein the carrier substrate comprises a ceramic substrate.

3. The semiconductor package of claim 1, wherein a maximum lateral dimension of the first portion of the TSV is greater than a minimum lateral dimension of the second portion of the TSV.

4. The semiconductor package of claim 1, wherein the TSV comprises a second patterned seed layer continuously connected to the first patterned seed layer of the first conductive pattern, and a second patterned conductive layer overlying the second patterned seed layer and continuously connected to the first patterned conductive layer of the first conductive pattern, wherein the first patterned seed layer of the first conductive pattern and the second patterned seed layer of the TSV separates the first patterned conductive layer and the second patterned conductive layer from the carrier substrate.

5. The semiconductor package of claim 4, further comprising:
   a second conductive pattern disposed on the carrier substrate and opposite to the first conductive pattern, and the second conductive pattern comprising:
   a third patterned seed layer connected to the second patterned seed layer and the second patterned conductive layer of the TSV; and
   a third patterned conductive layer underlying the third patterned seed layer.

6. The semiconductor package of claim 1, wherein the TSV is made of a conductive paste which is in direct contact with the carrier substrate and the first patterned seed layer of the first conductive pattern.

7. The semiconductor package of claim 6, further comprising:
   a second conductive pattern disposed on the carrier substrate and opposite to the first conductive pattern, and the second conductive pattern comprising
   a second patterned seed layer directly connected to the TSV; and
   a second patterned conductive layer underlying the second patterned seed layer.

8. A semiconductor package, comprising:
   a substrate structure comprising:
   a ceramic substrate comprising a first surface, a first inner sidewall connected to the first surface, a second surface opposite to the first surface, and a second inner sidewall connected to the first inner sidewall and the second surface, wherein an obtuse angle is between the first inner sidewall and the second inner sidewall;
   a through substrate via (TSV) penetrating through the ceramic substrate and being in contact with the first inner sidewall and the second inner sidewall; and
   a first conductive pattern disposed on the ceramic substrate and connected to the TSV, and comprising a first patterned seed layer disposed on the first surface of the ceramic substrate, and a first patterned conductive layer extending across the TSV and overlying the first patterned seed layer;
   a semiconductor die disposed on the substrate structure and electrically coupled to the TSV through the first conductive pattern; and
   an insulating encapsulation disposed on the substrate structure and encapsulating the semiconductor die.

9. The semiconductor package of claim 8, wherein an obtuse angle is between the first surface and the first inner sidewall, and an acute angle is between the second surface and the second inner sidewall.

10. The semiconductor package of claim 8, wherein the TSV comprises:
    a first tapered portion connected to the first inner sidewall of the ceramic substrate; and
    a second tapered portion connected to the first portion and the second inner sidewall of the ceramic substrate, wherein the first tapered portion has a thickness less than a thickness of the second tapered portion.

11. The semiconductor package of claim 8, wherein:
    the TSV comprises a second patterned seed layer lining the first inner sidewall and the second inner sidewall of the ceramic substrate and connected to the first patterned seed layer of the first conductive pattern, and a second patterned conductive layer overlying the second patterned seed layer and connected to the first patterned conductive layer of the first conductive pattern.

12. The semiconductor package of claim 11, further comprising:

a second conductive pattern disposed on the ceramic substrate and opposite to the first conductive pattern, and the second conductive pattern comprising:
a third patterned conductive layer, and
a third patterned seed layer interposed between the third patterned conductive layer and the TSV, and the third patterned seed layer connected to the second patterned seed layer and the second patterned conductive layer of the TSV.

13. The semiconductor package of claim 8, wherein the TSV is made of a conductive paste which is in physical contact with the first inner sidewall and the second inner sidewall of the ceramic substrate.

14. The semiconductor package of claim 13, wherein the first patterned seed layer is interposed between the TSV and the first patterned conductive layer, and the semiconductor package further comprises:
a second conductive pattern comprising a second patterned conductive layer and a second patterned seed layer interposed between the TSV and the second patterned conductive layer.

15. The semiconductor package of claim 13, wherein one end of the TSV is substantially leveled with the first surface of the ceramic substrate, and the other end of the TSV is substantially leveled with the second surface of the ceramic substrate.

16. The semiconductor package of claim 8, wherein a rear surface of the semiconductor die is attached to the ceramic substrate and surrounded by the first conductive pattern.

17. A manufacturing method of a semiconductor package, comprising:
forming a carrier substrate with a via hole, wherein after the via hole is formed, the carrier substrate comprises a first inner sidewall and a second inner sidewall connected to the first inner sidewall, and an obtuse angle is formed between the first inner sidewall and the second inner sidewall;
forming a through substrate via (TSV) in the via hole of the carrier substrate;
forming a conductive pattern on the carrier substrate and overlying the TSV, wherein the conductive pattern comprises a patterned seed layer and a patterned conductive layer overlying the first patterned seed layer;
disposing a semiconductor die on the carrier substrate, wherein the semiconductor die is surrounded by the conductive pattern; and
forming an insulating encapsulation on the carrier substrate to cover the semiconductor die.

18. The manufacturing method of claim 17, wherein forming the carrier substrate with the via hole comprises:
removing a portion of a ceramic substrate to form the via hole by using a diode-pumped solid state laser drilling process.

19. The manufacturing method of claim 17, wherein forming the TSV and the conductive pattern comprises:
conformally forming a seed material on the carrier substrate;
forming a conductive material on the seed material;
patterning the conductive material and the seed material to form the TSV in the via hole and the conductive pattern connected to the TSV.

20. The manufacturing method of claim 17, wherein forming the TSV and the conductive pattern comprises:
printing a conductive paste in the via hole of the carrier substrate to form the TSV; and
sequentially forming a seed material and a conductive material on the TSV to form the conductive pattern.

* * * * *